(12) United States Patent
Gupta et al.

(10) Patent No.: US 11,075,247 B2
(45) Date of Patent: Jul. 27, 2021

(54) CIRCUIT STRUCTURE AND METHOD FOR RESISTIVE RAM WITH SELF ALIGNED CONTACTS IN ZERO-VIA LAYER

(71) Applicant: GLOBALFOUNDRIES U.S. INC., Santa Clara, CA (US)

(72) Inventors: Anuj Gupta, Sunnyvale, CA (US); Bipul C. Paul, Mechanicville, NY (US); Joe A. Versaggi, Galway, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/691,694

(22) Filed: Nov. 22, 2019

(65) Prior Publication Data
US 2021/0159273 A1    May 27, 2021

(51) Int. Cl.
*H01L 27/24* (2006.01)
*H01L 45/00* (2006.01)
*G11C 13/00* (2006.01)

(52) U.S. Cl.
CPC ........ *H01L 27/2436* (2013.01); *G11C 13/003* (2013.01); *H01L 45/12* (2013.01); *H01L 45/1608* (2013.01); *G11C 2213/79* (2013.01)

(58) Field of Classification Search
CPC . H01L 27/2436; H01L 45/12; H01L 45/1608; G11C 13/003; G11C 2213/79
USPC ............................................................. 257/5
See application file for complete search history.

(56) References Cited

U.S. PATENT DOCUMENTS

| 8,144,509 | B2 | 3/2012 | Jung et al. |
| 8,441,850 | B2 | 5/2013 | Lee et al. |
| 9,711,215 | B2 | 7/2017 | Manipatruni et al. |
| 10,109,636 | B2 * | 10/2018 | Woo ................ H01L 21/76895 |
| 2013/0265821 | A1 | 10/2013 | Yang et al. |

\* cited by examiner

*Primary Examiner* — Tu-Tu V Ho
(74) *Attorney, Agent, or Firm* — Hoffman Warnick LLC

(57) ABSTRACT

The disclosure provides a circuit structure and method to provide self-aligned contacts in a zero-via conductor layer. The structure may include a device layer including a first contact to a first source/drain region, and a second contact to a second source/drain region, the first and second source/drain regions being separated by a transistor gate. A zero-via layer of the circuit structure may include: a first via conductor positioned on the first contact and self-aligned with an overlying metal level in a first direction; and a second via conductor positioned on the second contact and self-aligned with the overlying metal level in a second direction, the second direction being orthogonal to the first direction.

20 Claims, 18 Drawing Sheets

CIRCUIT STRUCTURE AND METHOD FOR RESISTIVE RAM WITH SELF ALIGNED CONTACTS IN ZERO-VIA LAYER

TECHNICAL FIELD

Embodiments of the disclosure relate generally to circuit structures for resistive random access memory (ReRAM). More specifically, embodiments of the disclosure include structures and methods to provide self-aligned contacts within a zero-via layer of an integrated circuit (IC).

BACKGROUND

Resistive random access memory (ReRAM) is an emerging and appealing sector of digital memory technology. ReRAM technology may use programmable elements of variable resistance to indicate high and low voltages. Data can be entered into resistive memory elements by changing their electrical resistance, and data can be read from the resistive memory elements by measuring a voltage drop across the element after it is programmed. Resistive memory elements may include, e.g., a two-terminal electrical pathway formed by two conductive terminals separated by a thin layer of dielectric material. Resistive memory elements fall into two basic categories based on the conduction filament being formed: either through the diffusion of a conducting species (typically referred to as a conductive bridge, or CBRAM), or through the formation and passivation of oxygen vacancies (typically referred to as OxRAM). Depending on the direction of current flows across the dielectric material from one terminal to the other, the current may cause ions to form within the dielectric alongside one of the terminals. This formation/disruption may substantially decrease/increase the electrical resistance across the resistive memory element.

A technical challenge associated with the forming of resistive memory elements is the forming of reliable connections between multiple layers of an integrated circuit within small surface areas. In conventional processing, vias are formed to connect a transistor source or drain to a resistive memory element in a metal level above the device layer. As mask sizes continue to shrink, it has become increasingly difficult to form openings for the vias within a photoresist with sufficient spacing from other openings. Such challenges may be especially pronounced by other design constraints, e.g., the position and layers where a bit line, source line, and word line will be formed to drive and control various operations of a transistor.

SUMMARY

A first aspect of the present disclosure provides a circuit structure including: a device layer including a first contact to a first source/drain region, and a second contact to a second source/drain region, the first and second source/drain regions being separated by a transistor gate; and a zero-via layer including: a first via conductor positioned on the first contact and self-aligned with an overlying metal level in a first direction; and a second via conductor positioned on the second contact and self-aligned with the overlying metal level in a second direction, wherein the second direction is orthogonal to the first direction.

A second aspect of the present disclosure provides a resistive random access memory (ReRAM) structure, including: a plurality of transistors within a device layer, wherein each transistor includes a first contact to a first source/drain region, and a second contact to a second source/drain region, the first and second source/drain regions being separated by a transistor gate coupled to a word line; a zero-via layer including: a plurality of first via conductors each positioned on a respective first contact of one of the plurality of transistors, and self-aligned in a first direction with an overlying metal level, and a plurality of second via conductors, each second via conductor positioned on a respective second contact of one of the plurality of transistors, and self-aligned with the overlying metal level in a second direction, wherein the second direction is orthogonal to the first direction; and a plurality of resistive memory elements each coupled to one of the plurality of first via conductors, wherein at least one of the plurality of resistive memory elements is coupled to a bit line, and at least one of the second via conductors is coupled to a source line.

A third aspect of the present disclosure provides a method of forming a circuit structure, the method including: forming a device layer including a first contact to a first source/drain region, and a second contact to a second source/drain region, the first and second source/drain regions being separated by a transistor gate; forming an inter-level dielectric (ILD) on the device layer; forming a first opening over the first contact and a second opening over the second contact by removing portions of the ILD; and forming a first via conductor within the first opening and a second via conductor within the second opening; forming an overlying metal layer on the first via conductor and the second via conductor, wherein the first via conductor is self-aligned in a first direction with the overlying metal level, the second via conductor is self-aligned in a second direction with the overlying metal level, and wherein the second direction is orthogonal to the first direction.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
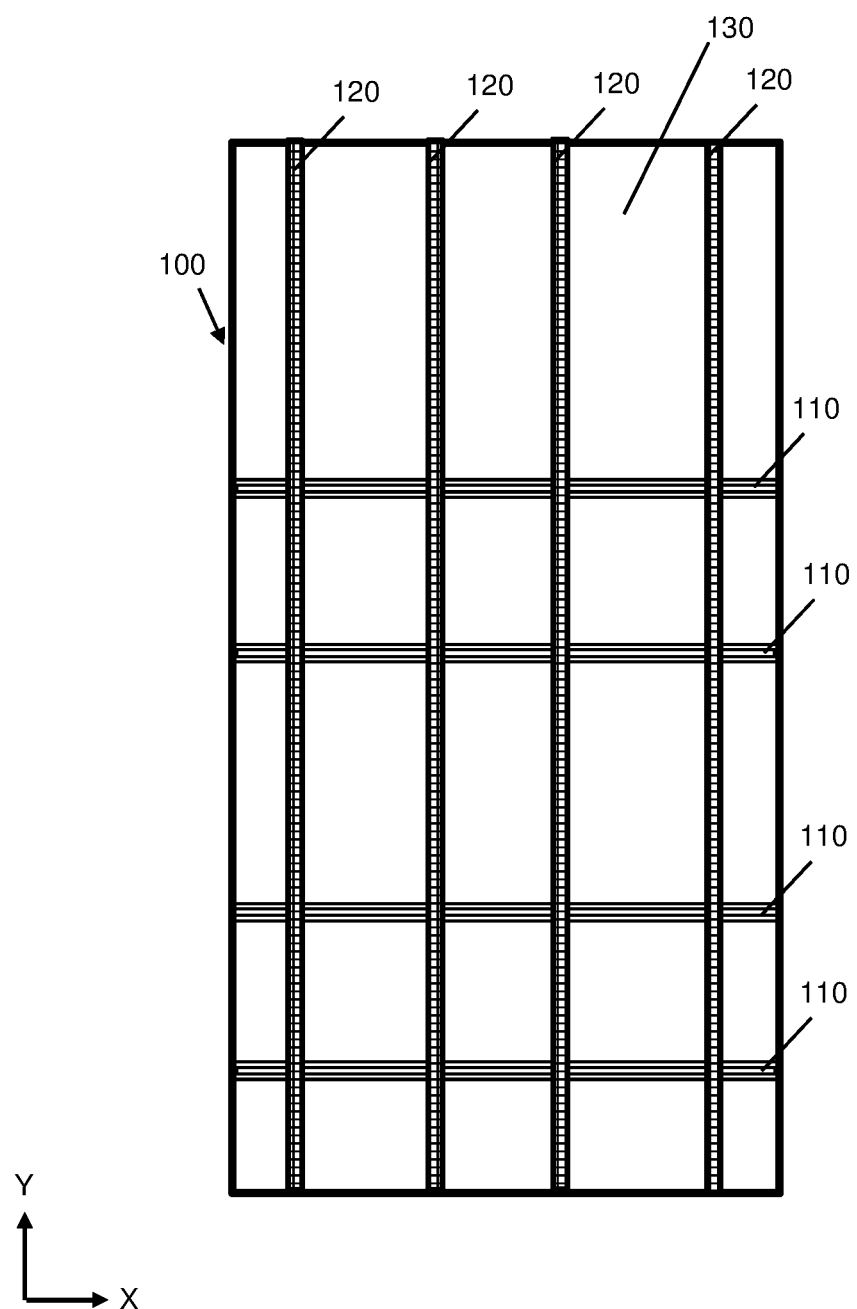
FIG. 1 shows a plan view of a preliminary structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to a circuit structure and memory circuit for implementing resistive random access memory ("ReRAM") and related methods for storing electronic data. RAM is a critical element for the operation of integrated circuit (IC) technology. RAM refers to any type of memory cell which is designed to store data temporarily. RAM may take a variety of forms, including static RAM ("SRAM") or dynamic RAM ("DRAM"). RAM may be implemented using a wide variety of circuit structures, electronic elements, and/or device architectures. The components of RAM provide a memory cell capable of electronically storing data in the form of a binary digit, i.e., a recorded high or low voltage to implement various types of logic. During operation, the memory cells in RAM must be configured for ease of writing information (i.e., storing high and low voltages) and reading information (i.e., identifying the stored voltage in a given cell).

ReRAM may be formed by using resistive memory elements such as memristors and/or other variable resistors whose resistance may change from high or low values upon experiencing a threshold electrical current. Resistive memory elements may include, e.g., a two-terminal electrical pathway formed by two conductive terminals separated by a thin layer of dielectric material. As current flows across the dielectric material from one terminal to the other, the current may cause ions to form within the dielectric alongside one of the terminals and thus change the resistance across the resistive memory element. Although ReRAM has emerged as a possible option for immproving device reliability and speed, it has become increasing difficult to form resistive memory elements and their accompanying vias in compliance with spacing requirements. Embodiments of the disclosure provide a circuit structure including a zero-via layer with conductors that are self-aligned with conductive portions of an overlying metal level. The term "self-alignment," or "self-aligned," as used herein, refers to a type of alignment by which metal wires may be formed in direct contact with underlying via conductors by direct metal deposition and planarization (implemented, e.g., with damascene processing) to a desired height. A self-aligned via may exhibit a horizontal width which is similar or equal to the overlying metal wire, and greater than underlying contacts to a transistor. In some cases, the zero-via layer mask may include a "mesh" structure where some openings extend in a first direction and other openings extend in a second direction orthogonal to the first direction. As used herein, the term mesh may refer to a photoresist structure which includes a set of openings in a grid configuration, i.e., several openings extend horizontally from left to right along one axis while others extend horizontally from left to right along an orthogonal axis. The various openings in a mesh may intersect each other at respective locations. In cases where a negative resist is used instead of a positive resist, the photoresist material itself may have a mesh-shape, with openings in the material taking the form of quadrilateral-shaped spaces between the photoresist material. The first and second via conductors thus may be self-aligned with overlying metal wires in the first and/or second direction, respectively.

FIG. 1 provides a plan view of a device layer 100 to be processed according to the present disclosure. The example device layer 100 of FIG. 1 illustrates one preliminary set of materials targeted for use with embodiments of the disclosure, but it is understood that embodiments of the disclosure can be implemented on different designs without any change to the techniques discussed herein. Device layer 100 can include a set (i.e., one or more) of active semiconductor regions 110 depicted as fins extending in a first direction, with eight active semiconductor regions 110 being provided for the sake of example. It is understood that active semiconductor regions 110, despite being depicted as fins in the accompanying FIGS., may take the form of any conceivable structure for providing active semiconductor material of a transistor, e.g., planar semiconductor material, nanosheet semiconductor regions, vertically-oriented semiconductor regions, etc. Device layer 100 may also include a set (i.e., one or more) gate structures 120 extending transversely over active semiconductor regions 110, with each gate structure 120 having one or more regions positioned over corresponding active semiconductor regions 110 in device layer 100. Thus, each gate structure 120 may separate portions of a corresponding active semiconductor region 110 into first and second source/drain regions with gate structure 120 being positioned therebetween. Each active semiconductor region 110 may be further subdivided into different source/drain regions by forming one or more diffusion break regions therein, according to processes generally known in the art.

Each active semiconductor region 110 can be formed from an underlying semiconductor substrate 130, e.g., by removing targeted portions of substrate 130 to a predetermined depth, causing the non-removed portions to form active semiconductor regions 110 directly on substrate 130. Active semiconductor region(s) and substrate 130 can include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 130 may include shallow trench isolation (STI) regions (not shown) between active semiconductor regions 110 and gate structures 120 where desired. The composition and use of such STI regions is generally understood in the art and not discussed in further detail. Active semiconductor regions 110 and gate structures 120 of device layer 100 thus may provide the fundamental components of a transistor.

Figure 2:
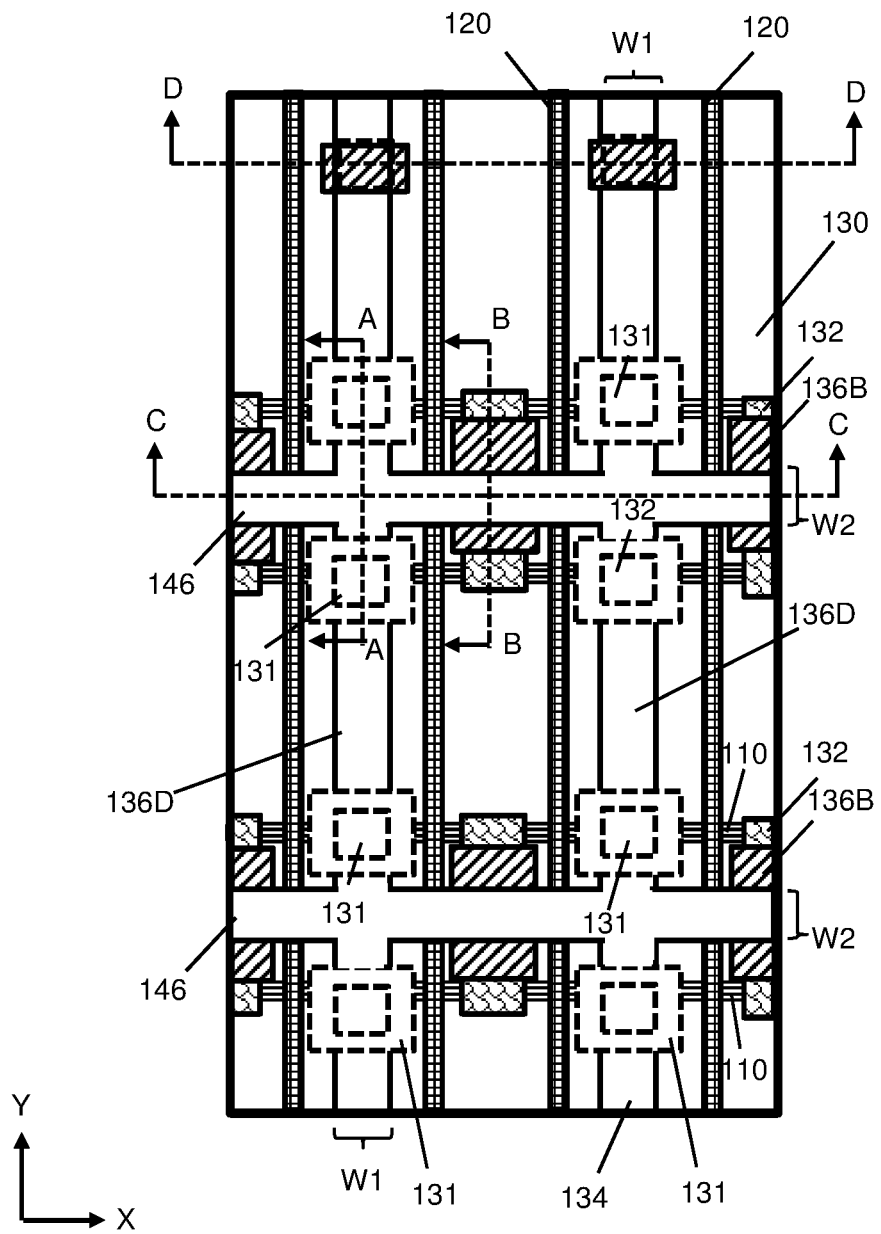
FIG. 2 shows a plan view of the preliminary structure with a zero-via photoresist and targeted locations for resistive memory elements according to embodiments of the disclosure.

Turning to FIG. 2, device layer 100 may be processed to form a circuit structure according to various embodiments of the disclosure, such as a resistive random access memory (ReRAM) structure. Methods to form such structures according to embodiments of the disclosure are discussed herein. To form a ReRAM structure, middle of line (MOL) processing includes the forming of conductive connections between various active semiconductor regions 110 and gate structures 120 to metal wires in other metal layers of a device. In the case of a RAM cell, subsequent processing will form connections from device layer 100 to one or more metal layers with a source line, bit line, and word line therein. As will be discussed elsewhere herein, one or more of such layers may have two of the three lines (i.e., source line, bit line, and/or word line) therein to reduce the surface area required for implementing a RAM cell. The source line refers to an electrical coupling for driving the operation of selected transistors and/or memory cells, the bit line refers to the electrical pathway for writing data to a RAM cell and thus may be coupled to a resistive memory element. The word line refers to the electrical pathway for controlling whether a RAM cell will read or write data.

Portions of device layer 100 may be targeted for the subsequent forming of resistive memory elements for the storage and retrieval of digital data. Various portions of active semiconductor regions 110 may be located beneath memory sites 131 where resistive memory elements may be positioned within a zero-via layer. In conventional RAM processing, dielectric material over device layer 100 may be targeted and processed in isolation through various masks, and memory sites 131 may be defined in a photomask as isolated locations where metal may be deposited. Embodiments of the disclosure differ from conventional processing, e.g., by forming a dielectric material of device layer 100 and forming openings which extend laterally over several memory sites 131 in one direction (e.g., parallel to the Y-axis). Additionally, embodiments of the disclosure may include forming additional openings which extend laterally over several contacts to active semiconductor regions 110 in a direction orthogonal to the openings where contacts to memory sites 131 will be formed. The shape of the formed openings may provide self-alignment between vertical conductors to device layer 100 and metal wires of an overlying metal level.

Figure 3A:
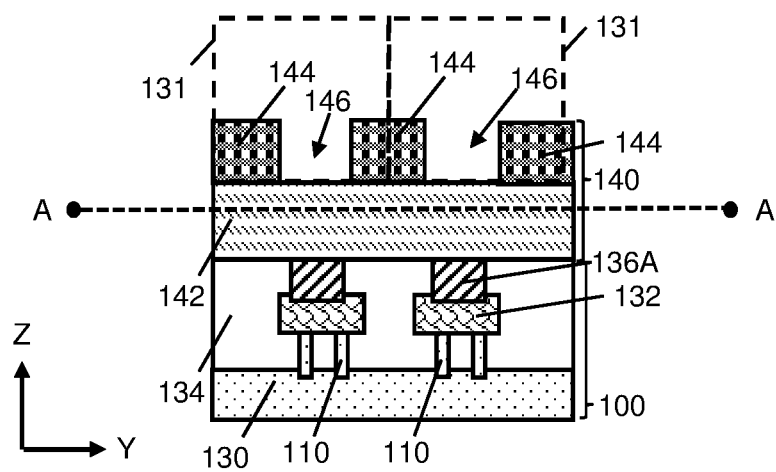
FIG. 3A shows a first cross-sectional view along line A-A of FIG. 2 of a preliminary structure with a first zero-via photoresist according to embodiments of the disclosure.
Figure 3B:
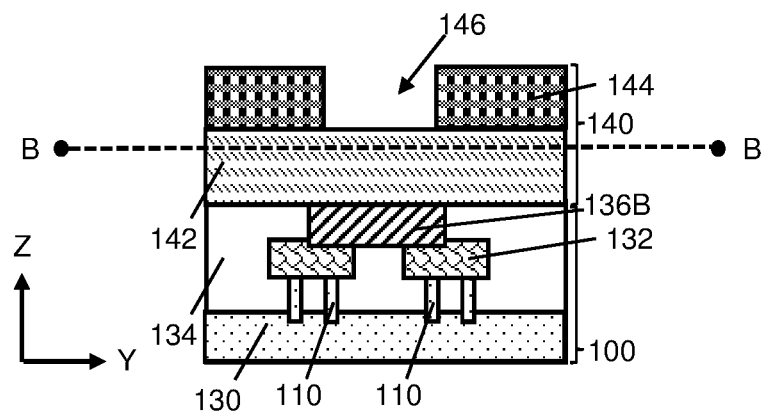
FIG. 3B shows a second cross-sectional view along line B-B of FIG. 2 of a preliminary structure with a first zero-via photoresist according to embodiments of the disclosure.
Figure 3C:
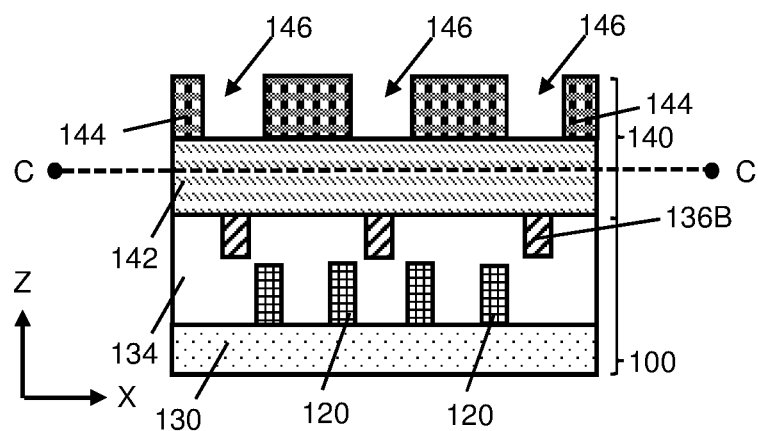
FIG. 3C shows a third cross-sectional view along line C-C of FIG. 2 of a preliminary structure with a first zero-via photoresist according to embodiments of the disclosure.
Figure 3D:
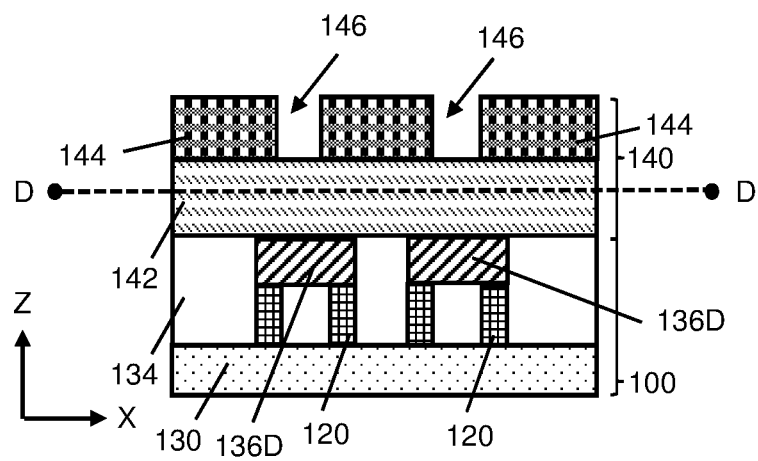
FIG. 3D shows a fourth cross-sectional view along line D-D of FIG. 2 of a preliminary structure with a first zero-via photoresist according to embodiments of the disclosure.

Referring to FIGS. 3A-3D together, embodiments of the disclosure include MOL processing of device layer 100. FIG. 3A provides a first cross-sectional view of device layer 100 along line A-A of FIG. 2. FIG. 3B provides a second cross-sectional view of device layer 100 along line B-B of FIG. 2. FIG. 3C provides a third cross-sectional view of device layer 100 along line C-C of FIG. 2. FIG. 3D provides a fourth cross-sectional view of device layer 100 along line D-D of FIG. 2. Although FIG. 3D illustrates various components formed on gate structure(s) 120 as being horizontally distal to active semiconductor regions 110, these components alternatively may be formed at other locations on device layer 110 in further embodiments. Various embodiments of the disclosure may include forming a zero-via layer, i.e., a layer with vertically-extending conductive material for coupling active semiconductor region(s) 110 and/or gate structure(s) 120 to the first metal layer of a device. Initial processing according to the disclosure may include, e.g., forming device layer 100 with initial conductive components for the coupling device layer 100 to a zero-via layer.

The forming of device layer 100 may include forming silicide regions 132 (FIGS. 3A, 3B) on portions of active semiconductor region(s) 110 which connect to overlying structures. Silicide regions 132 may be formed on multiple active semiconductor regions 110, where applicable, to provide more conductivity at the interface between a source/drain region and the conductor materials formed thereon. Silicide may be formed using any now known or later developed technique, e.g., performing an in-situ pre-clean, depositing a metal on active semiconductor region(s) 110 such as titanium, nickel, cobalt, etc., annealing to have the metal react with silicon, and removing unreacted metal to yield silicide region(s) 132.

The forming of device layer 100 may also include, e.g., forming an insulator 134 (FIGS. 3A, 3B, 3C, 3D) on active semiconductor region(s) 110, gate structure(s) 120, substrate 130, and silicide region(s) 132 where applicable to electrically isolate the various components of device layer 100 from each other. Insulator 134 may include any currently known or later developed dielectric substance, and as examples may include silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), near frictionless carbon (NFC), a spin-on silicon-carbon containing polymer material available from JSR Corporation, other low dielectric constant (<3.9) material, or layers thereof.

Portions of insulator 134 in device layer 100 may be removed (e.g., by etching) and filled with first contacts 136A (FIG. 3A), and second contacts 136B (FIGS. 3B, 3C), to first and second source/drain regions of active semiconductor region(s) 110, respectively. A gate contact 136D may similarly be formed by removing portions of insulator 134 over gate structure(s) 120 and depositing a conductive material. Though not shown in the accompanying FIGS., a barrier liner may also be deposited on the sidewalls of insulator 134 and may precede contact 136A, 136B, 136D deposition. The deposited barrier liner may include any now known or later developed barrier liner material (e.g., refractory metal liner) including but not limited to: tantalum nitride (TaN) and tantalum; tantalum nitride, tantalum and cobalt; and magnesium (Mn), or combinations thereof. Contacts 136A, 136B, 136D may be formed of any currently known or later developed conductive material suitable for defining the terminal of a transistor, e.g., copper (Cu), aluminum (Al), and/or other metals capable of being formed by deposition. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. Contacts 136A, 136B, 136D in some cases may have the same or similar material compositions, and may differ solely by being formed in different locations and/or to serve differing purposes in a circuit structure. First contact 136A may be formed on a single silicide region 132, e.g., as shown in FIG. 3A. Second contact 136B may be distinguished from first contact 136A, e.g., by being formed on multiple silicide regions 132 and thus being electrically coupled to multiple source/drain regions in device layer 100. Gate contact 136D may be the only contact material formed in physical and electrical contact with gate structures 120, thereby allowing the application of voltage to gate structures 120.

Continued processing according to the disclosure may include forming a zero-via layer 140 on device layer 100 to connect active semiconductor region(s) 110 and gate structure(s) 120 to overlying layers for controlling the operation of transistors and/or memory cells within device layer 100. A "zero-via layer" refers to the intermediate layer formed on device layer 100 to connect device layer 100 to overlying metal levels of a structure. The forming of zero-via layer 140 may include, e.g., forming an inter-layer dielectric (ILD) 142 on device layer 100 after contacts 136A, 136B, 136D are formed. ILD 142 may be formed to include one or more of the same dielectric materials as insulator 134 of device layer 100, and/or may include other currently known or later developed insulative materials. ILD 142 may be formed by deposition and/or any other process capable of forming dielectric material(s) on device layer 100. Embodiments of the disclosure target and process portions of ILD 142 differently from conventional techniques, e.g., by forming openings for self-alignment of via conductors with targeted portions of device layer 100. As will be discussed herein, such openings may take the form of a mesh for exposing and processing of aligned contacts 136A, 136B.

Referring to FIGS. 2 and 3A-3C together, the forming of a first zero-via first zero-via photoresist 144 (FIGS. 3A, 3B, 3C only) is shown according to various embodiments. First zero-via photoresist 144 is transparent in FIG. 2 solely for ease of illustrating device layer 100 components. First zero-via photoresist 144 may also be formed by deposition, and may provide a radiation sensitive coating for one or more layers which are to be treated (e.g., ILD 142), in some manner, such as to be selectively doped and/or to have a pattern transferred thereto. First zero-via photoresist 144, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned version of first zero-via photoresist 144. First zero-via photoresist 144 can then serve as a mask for the underlying layers which can then be selectively treated, such as to receive dopants and/or to undergo etching, for example. In the example of FIGS. 3A, 3B, 3C, first zero-via photoresist 144 includes openings 146. Openings 146 allow underlying portions of ILD 142 to be etched and processed, while first zero-via photoresist 144 prevents underlying portions of ILD 142 and device layer 100 from being affected by the etching, deposition, etc. As best shown in FIG. 2, openings 146 may be patterned in the shape of a mesh, with some openings extending across a first (e.g., latitudinal) direction while other openings extend across a second (e.g., longitudinal) direction orthogonal to the first direction. In this arrangement, some opening(s) 146 may have first width W1 while other openings(s) 146 may have a second width W2. First width W1 may be sized to extend beneath memory sites 131, and may also be sized for self-alignment with first contact(s) 136A (FIG. 3A). Second width W2 may be sized for self-alignment with second contact 136B to a set of silicide regions 132. In an example implementation, each width W1, W2 of opening(s) 146 may be, e.g., between approximately 0.01 and 0.03 micrometers (μm), but this may differ based on the size and scale of device layer 100. Opening(s) 146 of first zero-via photoresist 144 in embodiments of the disclosure may allow subsequent zero-via elements to be formed in self-alignment with contacts 136A, 136B without significant risk of misalignment or electrical shorting.

Figure 4A:
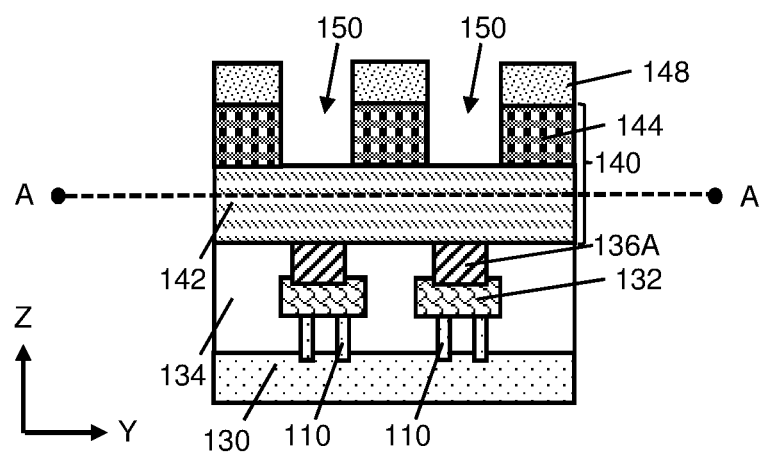
FIG. 4A shows the first cross-sectional view of the structure while forming an additional zero-via photoresist according to embodiments of the disclosure.
Figure 4B:
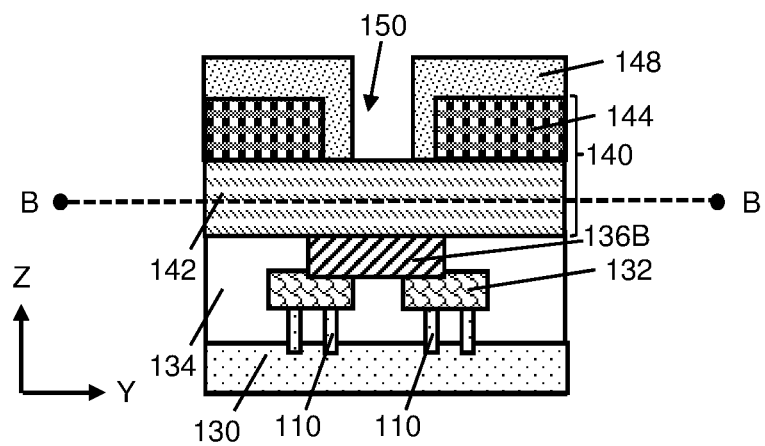
FIG. 4B shows the second cross-sectional view of the structure while forming an additional zero-via photoresist according to embodiments of the disclosure.
Figure 4C:
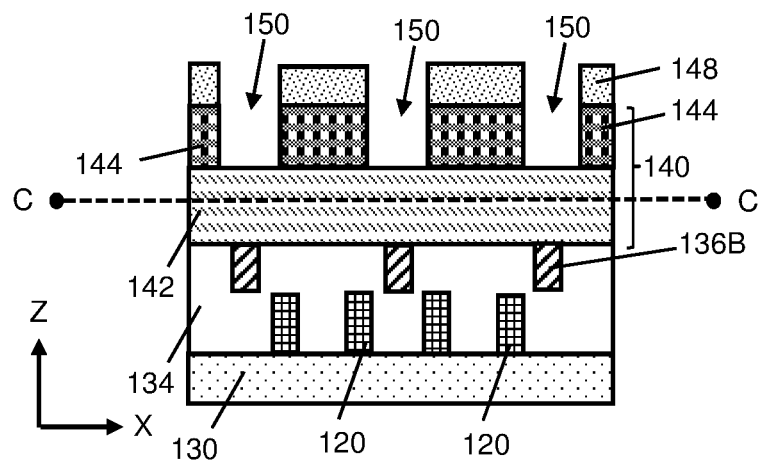
FIG. 4C shows the third cross-sectional view of the structure while forming an additional zero-via photoresist according to embodiments of the disclosure.
Figure 4D:
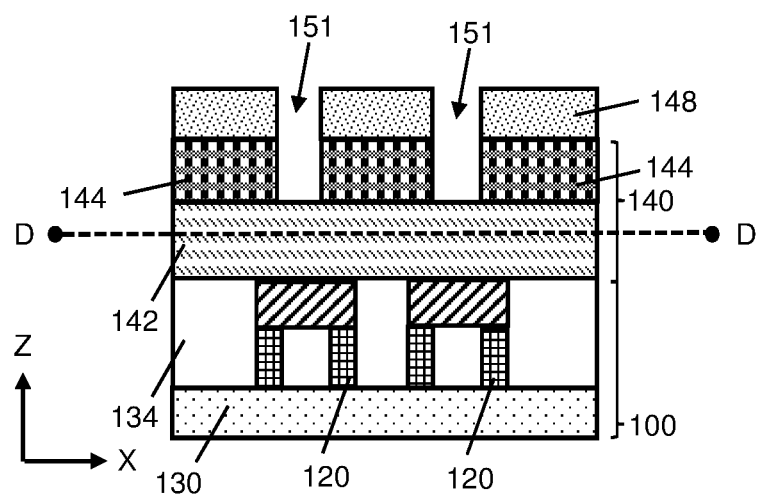
FIG. 4D shows the third cross-sectional view of the structure while forming an additional zero-via photoresist according to embodiments of the disclosure.
Figure 5:
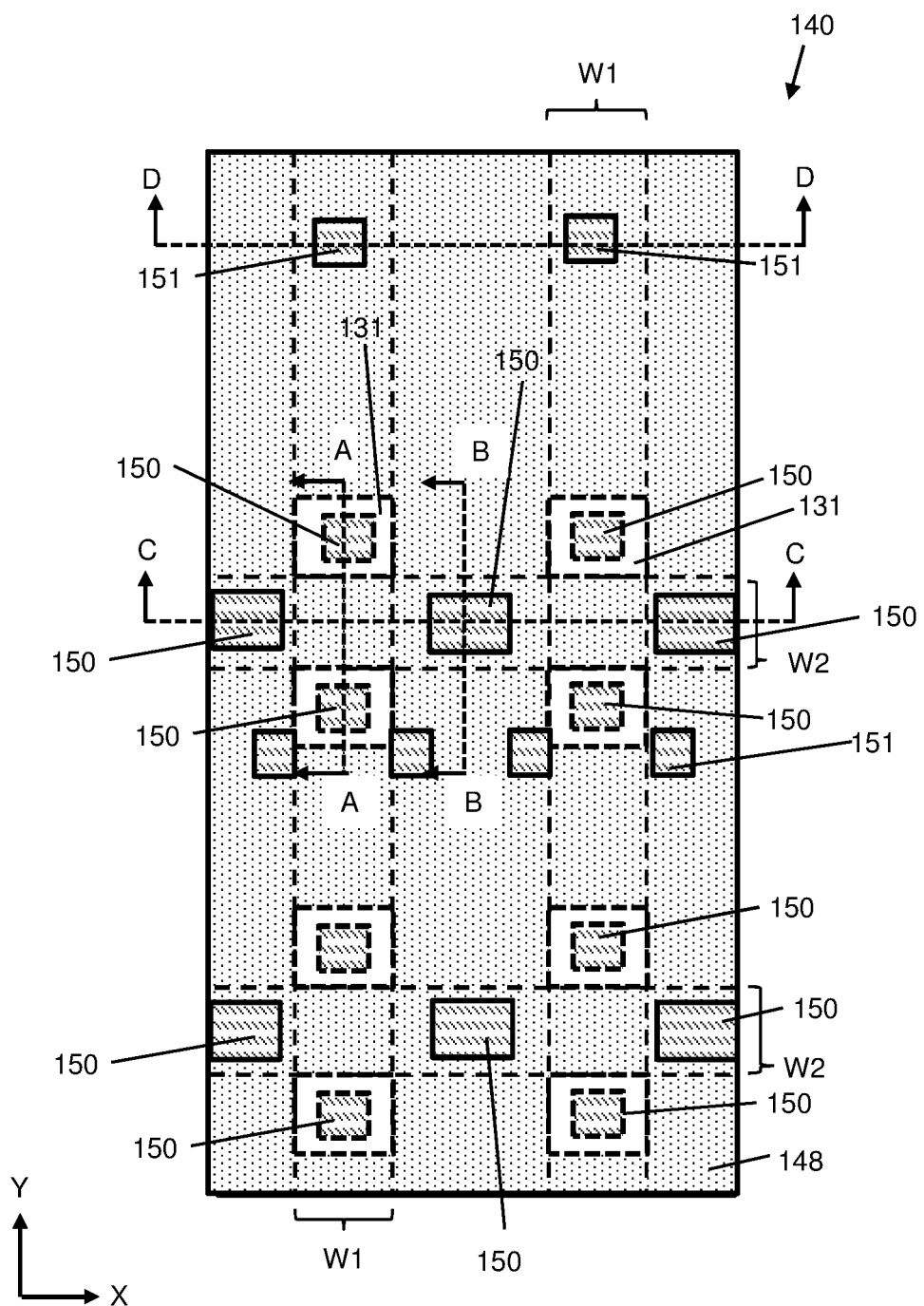
FIG. 5 shows a plan view of the structure with a zero-via photoresist according to embodiments of the disclosure.
Figure 6A:
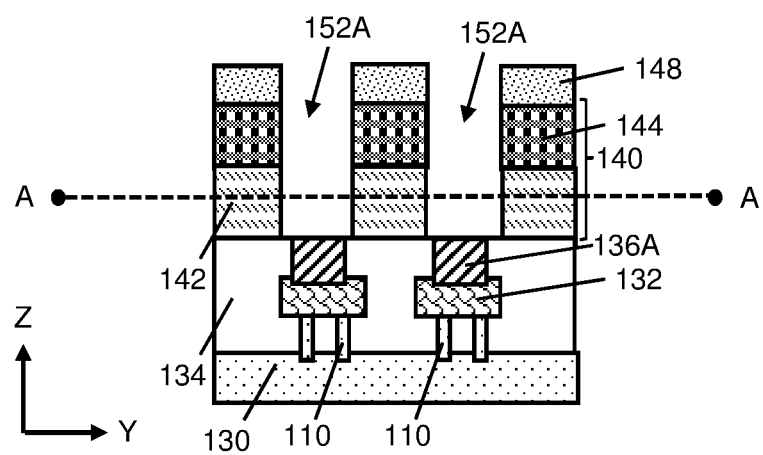
FIG. 6A shows the first cross-sectional view of the structure while forming a first opening according to embodiments of the disclosure.
Figure 6B:
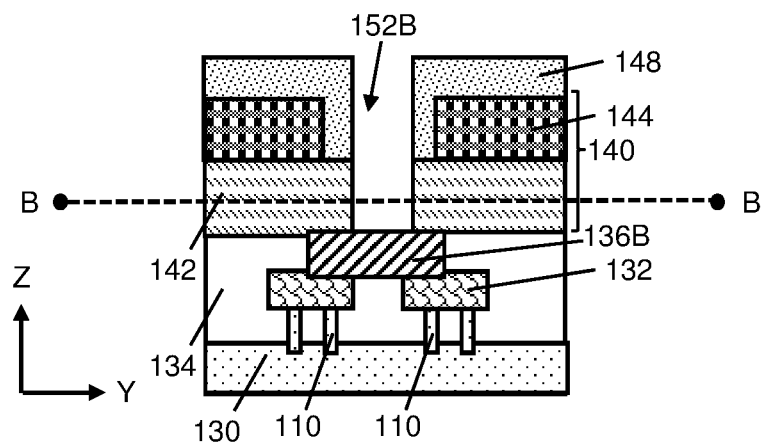
FIG. 6B shows the second cross-sectional view of the structure while forming a second opening according to embodiments of the disclosure.
Figure 6C:
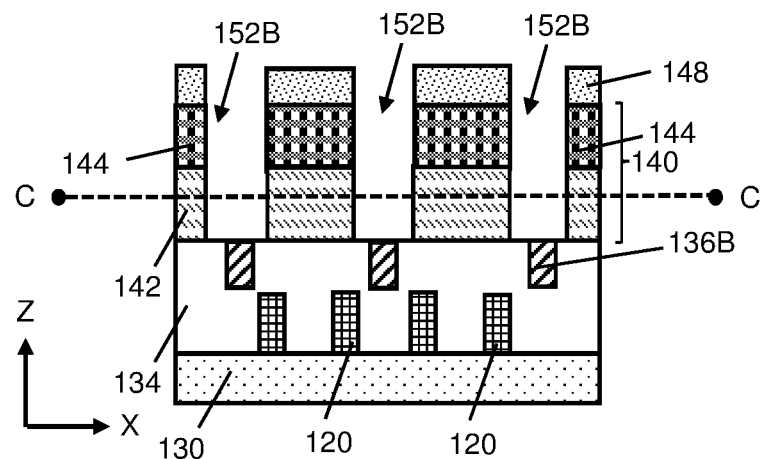
FIG. 6C shows the third cross-sectional view of the structure while forming second openings according to embodiments of the disclosure.
Figure 6D:
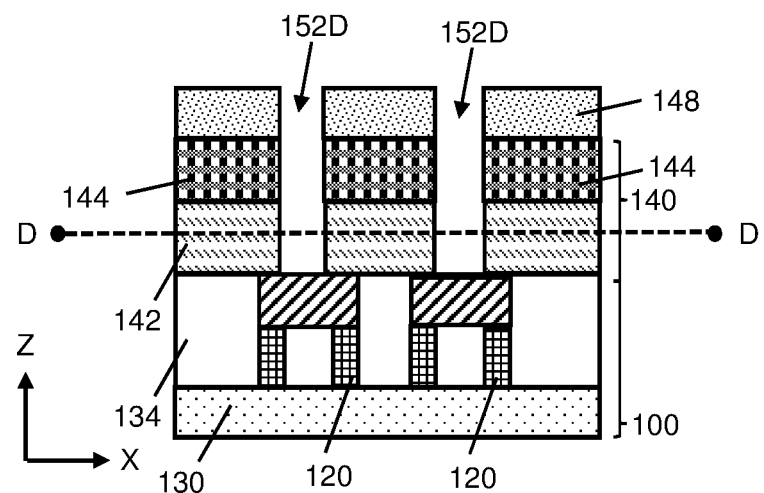
FIG. 6D shows the third cross-sectional view of the structure while forming gate openings according to embodiments of the disclosure.

Turning to FIGS. 4A-4D and 5, embodiments of the disclosure may include forming a second zero-via photoresist over ILD 142 and first zero-via photoresist 144 (FIGS. 4A-4D). Second zero-via photoresist may include openings 150 shaped to expose targeted portions of ILD 142. Zero via mask 148 may also include gate openings 151 (FIGS. 4D, 5) positioned for removing ILD 142 material above gate structure(s) 120 to form a word line connection for a ReRAM cell. Second zero-via photoresist may differ from first zero-via photoresist 144 in that openings 150 are not provided as a mesh, but instead as single openings to portions of ILD 142 targeted for removal. As shown in FIGS. 4B and 5, second zero-via photoresist may coat opposing sidewalls of first zero-via photoresist 144 in at least one horizontal direction (e.g., the Y-axis) but nonetheless may be shaped to expose at least a portion of ILD 142 material. Second zero-via photoresist is formed for subsequent removal of targeted ILD regions to expose contacts 136A, 136B, 136D. The exposing of contacts 136A, 136B, 136D in subsequent processing may allow via conductors to be formed with first zero-via photoresist 144 still in place, as discussed herein.

Turning to FIGS. 6A-6D, continued processing according to the disclosure may include forming a first opening 152A (FIG. 6A), a second opening 152B (FIGS. 6B, 6C), and a gate opening 152D (FIG. 6D), through ILD 142. The portions of ILD 142 removed with second zero-via photoresist in place may expose the upper surface of contacts 136A, 136B, 136D. The targeted portions of ILD 142 may be removed, e.g., by etching with second zero-via photoresist in place. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as first opening 152A, second opening 152B, and gate opening 152D through ILD 142. In some embodiments, each opening 152A, 152B, 152D may be formed by a single etching of ILD 142. By forming openings 152A, 152B, 152D to contacts 136A, 136B, 136D, via conductors subsequently formed in zero-via layer 140 may be self-aligned with the subsequently formed metal levels as discussed herein. As shown specifically in FIG. 6A, the width of first opening 152A may be aligned (e.g., along Y-axis) with opposing horizontal ends of first contact 136A.

Figure 7:
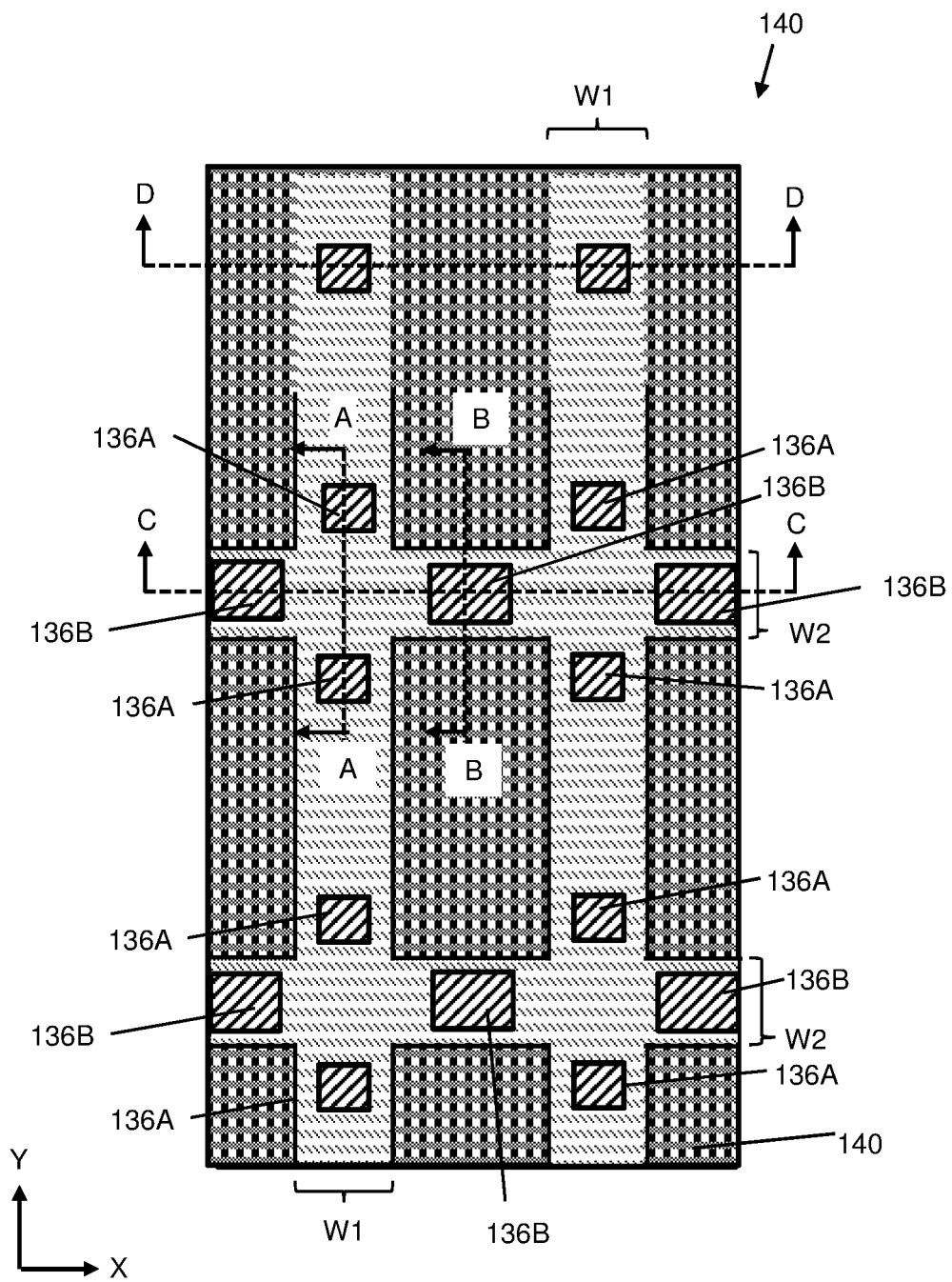
FIG. 7 shows a plan view of the structure before forming metal vias of the zero-via layer according to embodiments of the disclosure.
Figure 8A:
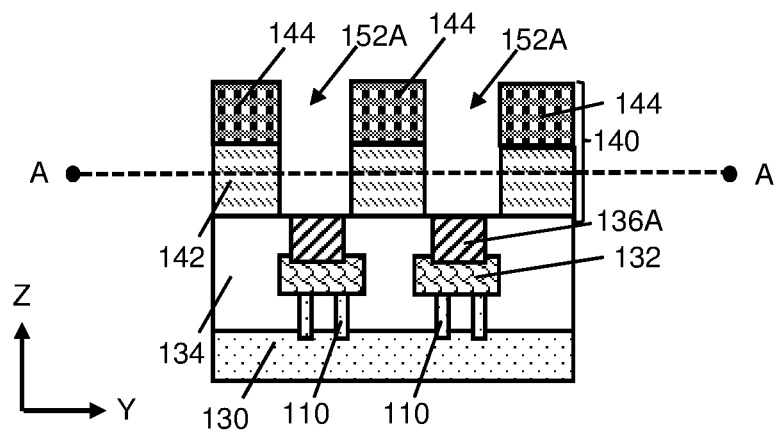
FIG. 8A shows the first cross-sectional view of the structure while removing the additional zero-via photoresist according to embodiments of the disclosure.
Figure 8B:
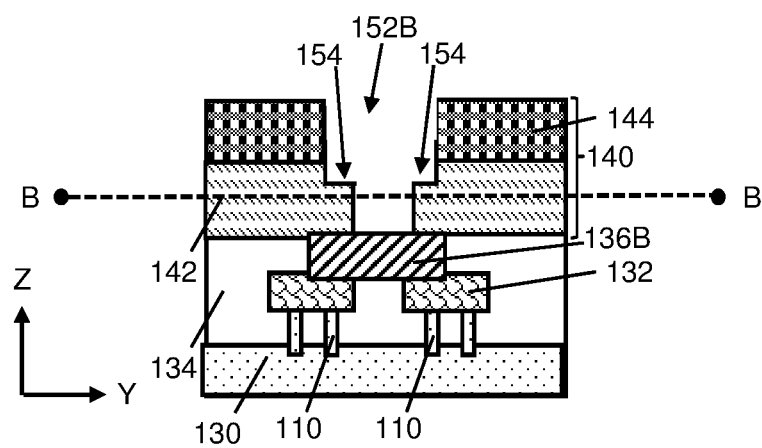
FIG. 8B shows the second cross-sectional view of the structure while removing the additional zero-via photoresist according to embodiments of the disclosure.
Figure 8C:
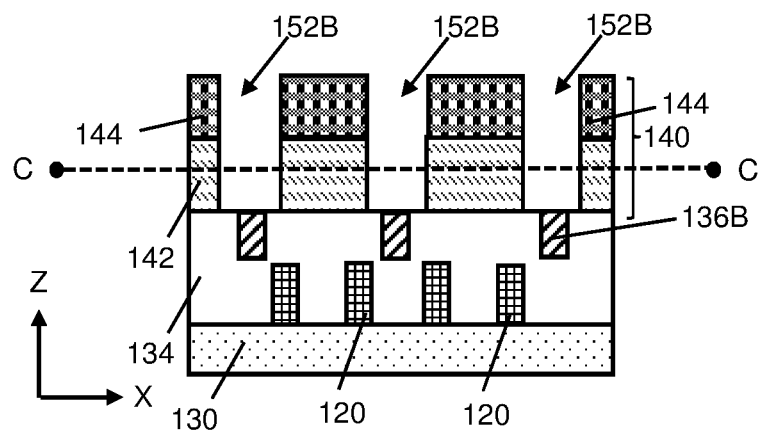
FIG. 8C shows the third cross-sectional view of the structure while removing the additional zero-via photoresist according to embodiments of the disclosure.
Figure 8D:
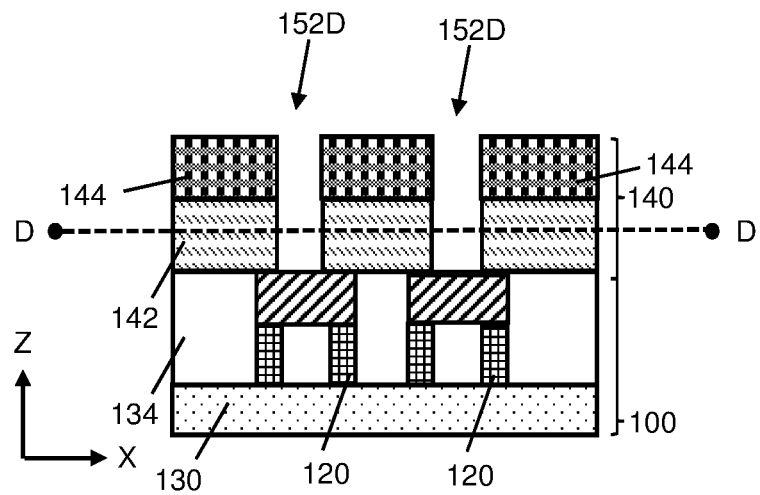
FIG. 8D shows the fourth cross-sectional view of the structure while removing the additional zero-via photoresist according to embodiments of the disclosure.

Referring now to FIGS. 7, and 8A-8C, continued processing according to the disclosure may include the removing of second zero-via photoresist (FIGS. 4A-4D, 5, 6A-6D) to re-expose photoresist(s) 144 and portions of ILD 142 previously covered by second zero-via photoresist. Second zero-via photoresist may be removed by stripping and/or any other process suitable to selectively remove masking material from the top of a structure. As shown in FIG. 7, the removing of second zero-via photoresist can re-expose the mesh shape of first zero-via photoresist 144. Additionally, ILD 142 includes the previously-formed openings 152A, 152B, 152D to contacts 136A, 136B, 136D. Furthermore, as specifically shown in FIG. 8B, continued processing may include etching an additional portion of ILD 142 to form a set of notches 154 above second contact 136B. Notches 154 may aid in the forming and placement of via conductors to second contact 136B, as discussed with regard to other processes. However, notches 154 need not be formed within ILD 142 above first contact 136A and gate contact 136D, due to the position of these materials within zero-via layer 140.

Turning to FIGS. 9A-9D, continued processing according to the disclosure may include forming a first via conductor 156A (FIG. 9A), a second via conductor 156B (FIGS. 9B, 9C), and a gate conductor 156D (FIG. 9D) within ILD 142.

Figure 9A:
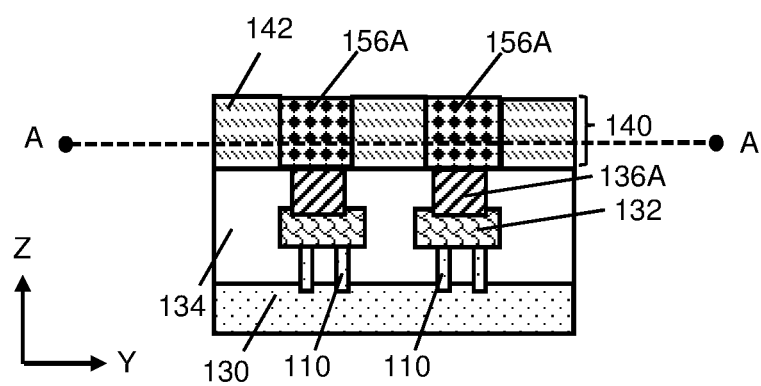
FIG. 9A shows the first cross-sectional view of the structure while forming a via conductor in a first opening according to embodiments of the disclosure.
Figure 9B:
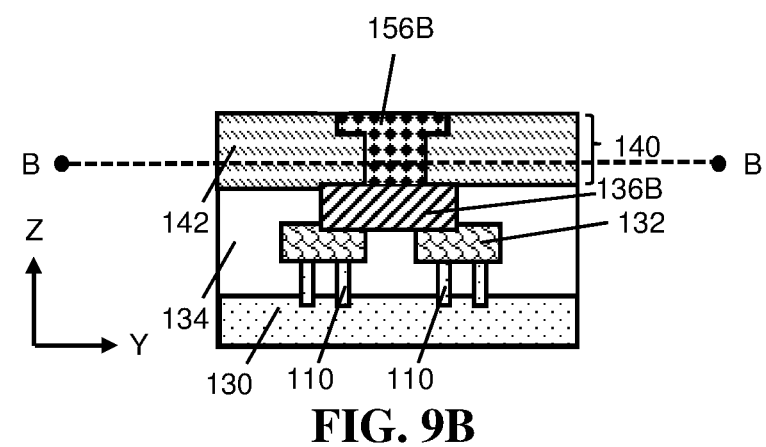
FIG. 9B shows the second cross-sectional view of the structure while forming a via conductor in a second opening according to embodiments of the disclosure
Figure 9C:
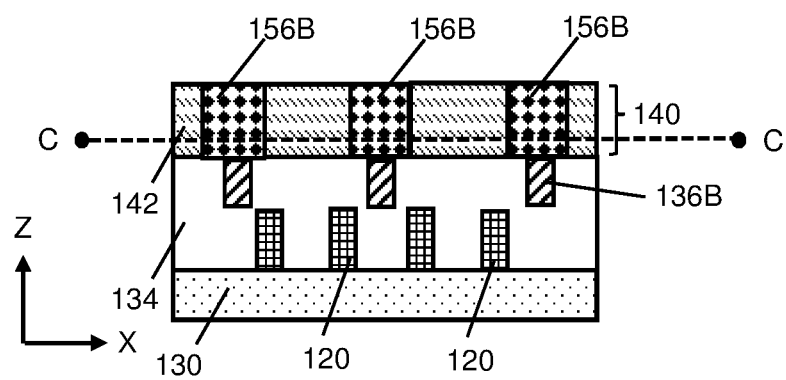
FIG. 9C shows the third cross-sectional view of the structure while forming the via conductor in a second opening according to embodiments of the disclosure.
Figure 9D:
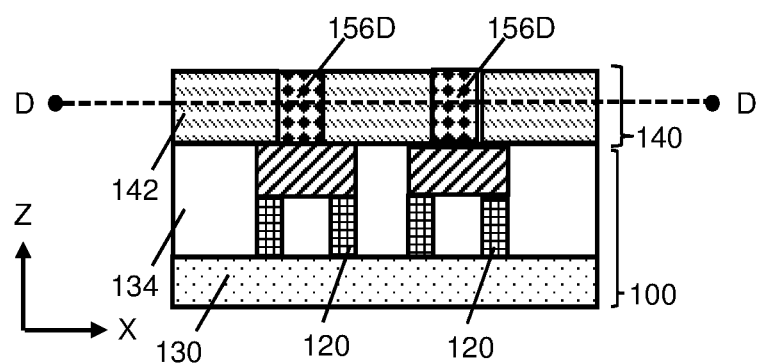
FIG. 9D shows the third cross-sectional view of the structure while forming a gate conductor in a second opening according to embodiments of the disclosure.

Via conductors 156A, 156B and gate conductor 156D may be formed, e.g., by deposition of conductive material, and subsequent planarization. In cases where notches 154 were formed previously within ILD 142, second via conductor(s) 156 may include as shown in FIG. 9B an upper portion with a greater width than a lower portion formed on second contact(s) 136B. First and second via conductors 156A, 156B and gate conductor 156D may include any now known or later developed conductive material for an IC such as but not limited to: copper, aluminum, etc. In some cases, the same deposition to form first and second via conductors 156A, 156B may be used to form electrical couplings to gate structure(s) 120 for a word line connection of a ReRAM cell. Though not shown in the accompanying FIGS., a barrier liner may also be deposited on the sidewalls of ILD 142 and may precede via conductor 156A, 156B and gate conductor 156D deposition. The deposited barrier liner may include any now known or later developed barrier liner material (e.g., refractory metal liner) including but not limited to: tantalum nitride (TaN) and tantalum; tantalum nitride, tantalum and cobalt; and magnesium (Mn), or combinations thereof. First and second via conductors 156A, 156B may be formed by a damascene process. Damascene is a process in which an interconnect pattern is first lithographically defined in a layer of dielectric, then metal is deposited to fill resulting wire trench openings or via openings, and then excess metal is removed by means of chemical-mechanical polishing (planarization). Dual damascene is a similar process in which interconnect patterns define wire trench openings and via openings together prior to metal deposition.

Referring now to FIGS. 10A-10D, embodiments of the disclosure may include forming a set of metal levels 160, a process which is generally known as back end of line (BEOL) processing. Each metal level 160 may include one or more metal wires 161, vias 162, and/or insulator regions 163. Metal wires 161 may be formed of any conductive metal and may horizontally transmit current from one location to another. Vias 162 may vertically transmit current from one metal level 160 to another. Insulator regions 163 physically and electrically isolate the various metal wires 161 and vias 162 from each other, except where metal wires 161 and vias 162 connect with each other.

Figure 10A:
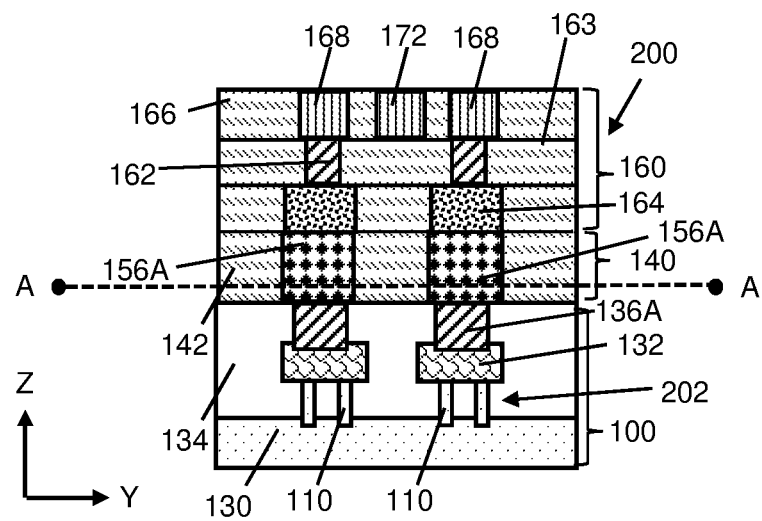
FIG. 10A shows the first cross-sectional view of the structure while forming a set of metal levels according to embodiments of the disclosure.

Metal levels 160 may also include various components for controlling the operation of a RAM cell such as a ReRAM cell, and thus may include various memory elements for storing and retrieving data. As shown in FIG. 10A, methods of the disclosure can include forming one or more metal levels (one shown by example in FIG. 10B) with metal wires 161 and/or vias 162 coupled to a resistive memory element 164 above first via conductor 156A. Resistive memory element 164 may be embodied as a metal-insulator-metal ("MIM") resistor. A MIM resistor refers to a structure which includes two portions of conductive material separated by a region of dielectric material. Such a device may operate by varying the resistance of the dielectric material. During operation, the dielectric material initially may be in a resistive state in which current flowing between the two portions of conductive material induces a significant voltage loss. However, the dielectric may be rendered conductive by forming a filament or conduction path by application of a sufficiently high voltage. The sufficiently high voltage may refer to any voltage level which causes metal ions and/or vacancies to form within the dielectric material proximate the portions of conductive material. The conduction path can arise from different mechanisms, including vacancy or metal defect migration. Once the conduction path is formed, it may be "reset" (i.e., restoring the initial high resistance) by another voltage. After being reset, the conduction path may be "set" (i.e., re-formed, restoring the lower resistance) by another voltage. In some instances, the multiple current paths may form in place of a single path or filament.

As is also shown in FIG. 10A, at least one metal level 160 may have one or more bit lines 168 for transmitting a current for writing data to and/or reading data from resistive memory element 166. Bit line(s) 168 may have a predetermined orientation an in X or Y axis, and as an example may extend in the direction of the X-axis such that bit line(s) 168 is coupled to multiple resistive memory elements 164. Thus, bit line(s) 168 may be electrically coupled to active semiconductor regions 110 through resistive memory element 164, first via conductor 156A, and first contact 136A. As shown in FIG. 10A, first via conductor(s) 156A may be self-aligned in a first direction (e.g., Y-axis) with resistive memory element 164 and bit line(s) 168 in the overlying metal level 160. Similarly, referring to FIGS. 10B and 10C, second via conductor(s) 156B may be self-aligned in a second direction (e.g., along X-axis as shown in FIG. 10C) with opposing horizontal ends of metal wires(s) 162 in overlying metal level(s) 160. Second via conductor 156B may not be self-aligned with the same components of metal level(s) 160 in an orthogonal direction (e.g., along Y-axis as shown in FIG. 10B).

Figure 10B:
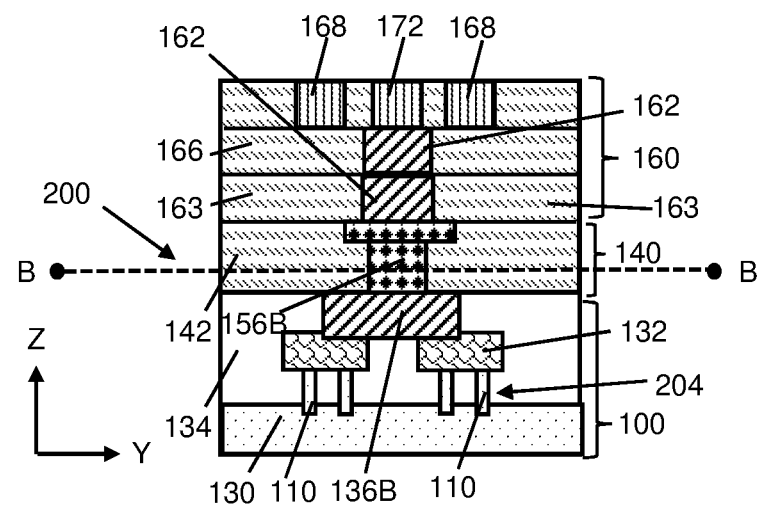
FIG. 10B shows the second cross-sectional view of the structure while forming a set of metal levels according to embodiments of the disclosure.
Figure 10C:
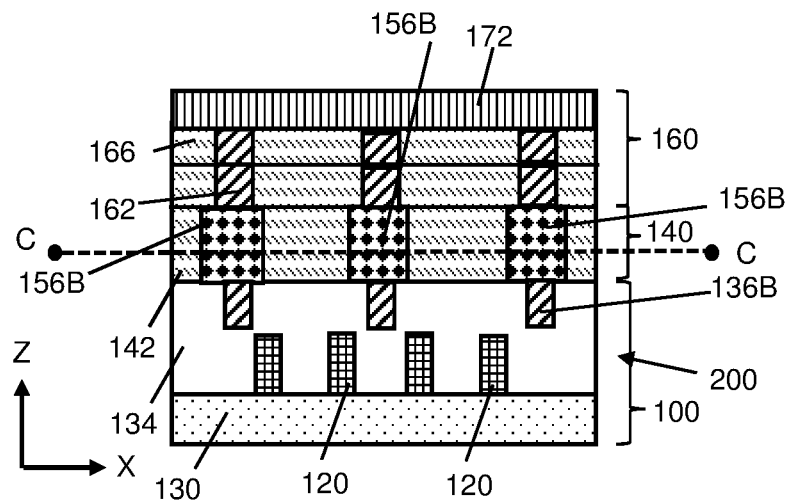
FIG. 10C shows the third cross-sectional view of the structure while forming a set of metal levels according to embodiments of the disclosure.

As shown in FIGS. 10B and 10C, metal levels 160 over second via conductor(s) 156B may be different from those over first contact(s) 156A. For example, metal levels 160 may include a via 162 which connects second via conductor 156B to one or more source lines 172. Source line(s) 172 may be coupled through second via conductor(s) 156B and second contact 136B to active semiconductor region(s) 110. In this arrangement, source line(s) 172 may be coupled to the junction between source and drain regions of two interconnected transistors of a ReRAM cell or similar structure. Source line(s) 172, similar to bit line(s) 168 may have a predetermined orientation and as shown in FIG. 10C may extend in the direction of the X-axis. Thus, in an example embodiment, bit and source line(s) 168, 172 may have a substantially parallel orientation and may be located in the same metal level (e.g., second metal level 166). Source line(s) 172 may be routed to only one memory cell in a logic array in some implementations, but it is understood that source line(s) 172 also may be shared across multiple memory cells in further implementations.

Figure 10D:
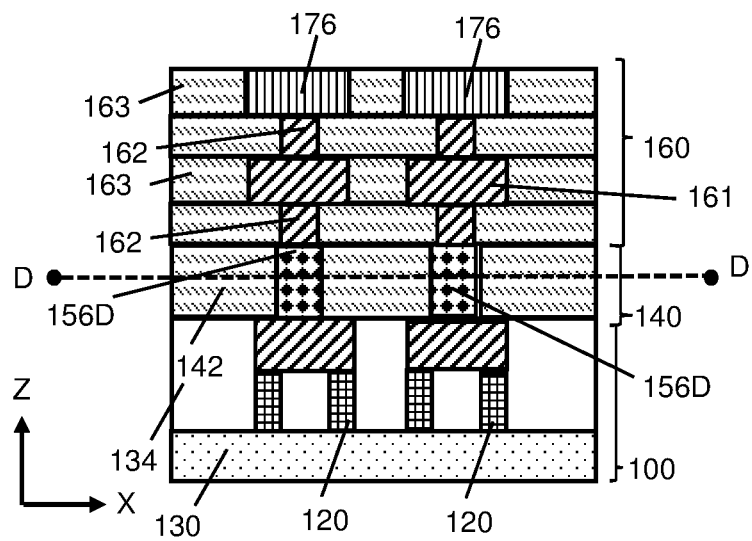
FIG. 10D shows the fourth cross-sectional view of the structure while forming a set of metal levels according to embodiments of the disclosure.
Figure 11:
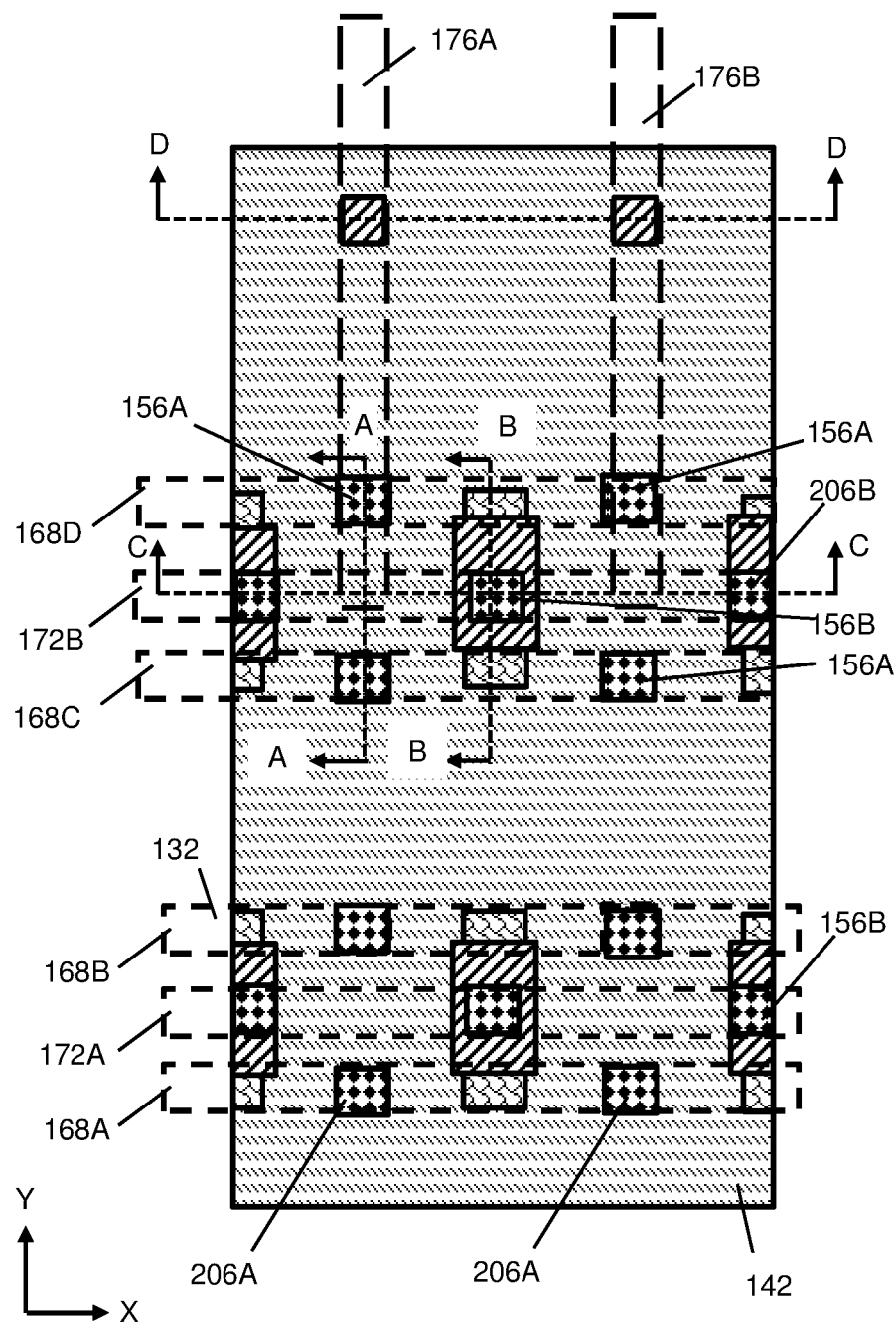
FIG. 11 shows a plan view of a circuit structure according to embodiments of the disclosure.

Referring to FIGS. 10D and 11 together, further processing according to the disclosure may include forming metal levels 160 to connect gate conductor(s) 156D to a set of word lines 176 (separately identified as 176A, 176B in FIG. 11). As noted elsewhere herein, word lines 176 may affect the current flow through active semiconductor regions 110 and thus may control whether resistive memory elements 164 will undergo read or write operations. Word line(s) 176 may have an orientation that is different from bit line(s) 168 and source line(s) 172, as shown by example in FIG. 11. For instance, word line(s) may extend in the direction of the Y-axis and thus may be orthogonal to bit and source lines 168, 172. Word line(s) 176 do not intersect with source line(s) 168 and/or bit line(s) 172, and thus may be positioned in a different metal level (e.g., a higher metal level) from bit line(s) 168 and/or source line(s) 172. In the example of FIG. 10D, word line(s) 176 may be located in a second metal level 160 which is above at least one other metal level, and thus may be coupled to gate conductor(s) 156D through two vias 162 and one metal wire 161.

Embodiments of the disclosure provide a circuit structure 200 with embodiments of zero-via layer as described herein.

Circuit structure 200 may include device layer 100 with first contact 136A to a first source/drain region 202 in the form of active semiconductor region 110. Device layer 100 may also include second contact 136B to a second source/drain region 204 in the form of another active semiconductor region 110. A transistor gate, indicated by gate structure 120 in FIG. 10C, may separate first and second source/drain regions 202, 204 from each other. As shown in FIG. 10A, first via conductor 156A may be self-aligned in a first direction (e.g., X-axis) with the elements of overlying metal level(s) 160 to which it connects, e.g., resistive memory element(s) 164 and bit line(s) 168. Second via conductor 156B may be self-aligned in a second direction, orthogonal to the first direction (e.g., Y-axis), with vias 162 and source line(s) 172 in overlying metal level(s) 160. First via conductor 156A may have a horizontal width that is greater than its underlying first contact 136A. Second via conductor 156B similarly may have a horizontal width that is greater than its underlying second contact 136B. As indicated in FIGS. 10A and 10C, first and second via conductors 156A, 156B each may include vertical sidewalls extending between first or second contact 146A, 136B, and metal level(s) 160. In some cases, the vertical sidewalls may extend to resistive memory element(s) 164 and select line(s) 172.

As shown specifically in FIG. 11, circuit structure 200 may include a third via conductor 206A with vertical sidewalls horizontally aligned with vertical sidewalls of first via conductor 156A. Circuit structure 200 may also include a fourth via conductor 206B with horizontal sidewalls horizontally aligned with second via conductor 156B. Thus, multiple via conductors 156A, 206A and/or 156B, 206B may be horizontally aligned as a result of being produced by second zero-via photoresist (FIGS. 4A-4D, 5, 6A-6D).

Figure 12:
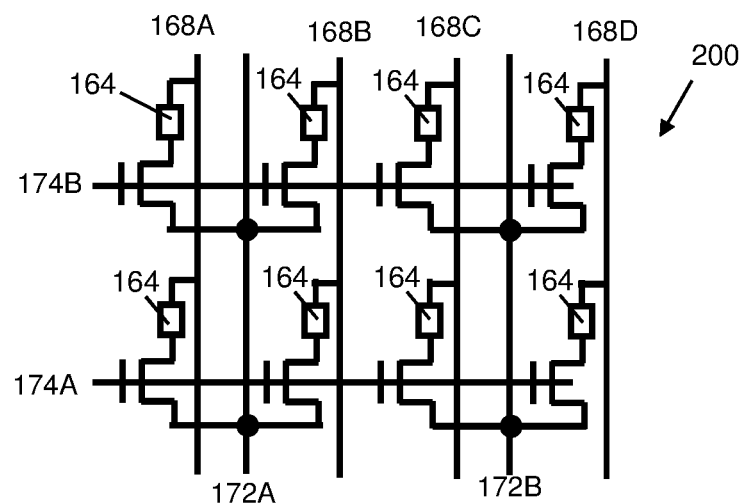
FIG. 12 shows a schematic view of a resistive random access memory (ReRAM) circuit configuration according to embodiments of the disclosure.

Referring to FIGS. 10A-10D, 11, and 12 together, in which FIG. 12 provides a schematic view of circuit structure 200 according to embodiments of the disclosure, additional components and features of circuit structure 200 are provided. Circuit structure 200 may operate as a ReRAM memory cell. As shown in FIG. 12, various bit lines (separately identified as 168A-168D) may be formed in one of metal levels 160 and various source lines 172A, 172B may also be formed in one of metal levels 160 (e.g., the same metal level as bit lines 168). Word lines 174A, 174B may also be formed in one of metal levels 160 and may be in a metal level different from bit line(s) 168 and/or source line(s) 172. Circuit structure 200 may also include resistive memory element(s) 164 coupled to respective bit lines 168A, 168B, 168C, 168D as shown. In the schematic arrangement of FIG. 12 where circuit structure 200 provides of a ReRAM structure, bit line(s) 168A-168D may be responsible for writing data to and/or reading data from resistive memory elements 164. Source line(s) 172A, 172B may extend in parallel to bit line(s) 168A-168D selectively provide current to one or more transistors coupled to resistive memory elements 164, and thus may be used to select whether one or more resistive memory elements 164 cells will undergo a write or read operation. Word lines 174A, 174B may be coupled to the gate of various transistors in circuit structure 200 to provide the data that is written to resistive memory elements 164 during operation.

Embodiments of the disclosure provide various technical and commercial advantages, some of which are described by example herein. For example, embodiments of the disclosure provide a zero-via photoresist which may exhibit a mesh shape to self-align via conductors with the overlying metal layer elements, thus providing reliable pathways to a source or drain region of a transistor. Embodiments of the disclosure also allow a source line and bit line of a ReRAM cell to be routed in parallel to each other within the same metal level, rather than requiring the source line(s) to extend in parallel with the word line(s). In this arrangement, the ReRAM cell may offer faster read speed than conventional ReRAM arrangements, and moreover allows for easier device scalability at smaller dimensions during fabrication.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   a device layer including a first contact to a first source/drain region, and a second contact to a second source/drain region, the first and second source/drain regions being separated by a transistor gate; and
   a zero-via layer including:
      a first via conductor positioned on the first contact and self-aligned with an overlying metal level in a first direction; and
      a second via conductor positioned on the second contact and self-aligned with the overlying metal level in a second direction, wherein the second direction is orthogonal to the first direction.

2. The circuit structure of claim 1, further comprising a plurality of transistors within the device layer, and wherein the zero-via layer further includes:
   a third via conductor to one of the plurality of transistors, wherein the third via conductor includes a set of vertical sidewalls horizontally aligned with a set of vertical sidewalls of the first via conductor; and
   a fourth via conductor to one of the plurality of transistors, wherein the fourth via conductor includes a set of vertical sidewalls horizontally aligned with a set of vertical sidewalls of the second via conductor.

3. The circuit structure of claim 1, wherein a width of the first via conductor is greater than a width of the first contact, and wherein a width of the second via conductor is greater than a width of the second contact.

4. The circuit structure of claim 1, further comprising:
   a resistive memory element coupled to the first via conductor;
   a bit line within the overlying metal level and coupled to the resistive memory element; and
   a select line within the overlying metal level coupled to the second contact, and extending in a direction parallel to the bit line.

5. The circuit structure of claim 4, wherein the bit line and the select line are within a same overlying metal level.

6. The circuit structure of claim 4, wherein the first via conductor includes vertical sidewalls extending between the first contact and the resistive memory element, and wherein the second via conductor includes vertical sidewalls extending between the second contact and the select line.

7. The circuit structure of claim 4, further comprising a word line coupled to the transistor gate, wherein the word line is within a metal level different from the overlying metal level.

8. A resistive random access memory (ReRAM) structure, comprising:
- a plurality of transistors within a device layer, wherein each transistor includes a first contact to a first source/drain region, and a second contact to a second source/drain region, the first and second source/drain regions being separated by a transistor gate coupled to a word line;
- a zero-via layer including:
    - a plurality of first via conductors each positioned on a respective first contact of one of the plurality of transistors, and self-aligned in a first direction with an overlying metal level, and
    - a plurality of second via conductors, each second via conductor positioned on a respective second contact of one of the plurality of transistors, and self-aligned with the overlying metal level in a second direction, wherein the second direction is orthogonal to the first direction; and
- a plurality of resistive memory elements each coupled to one of the plurality of first via conductors, wherein at least one of the plurality of resistive memory elements is coupled to a bit line, and at least one of the second via conductors is coupled to a source line.

9. The ReRAM structure of claim 8, wherein at least two of the first via conductors include vertical sidewalls in horizontal alignment with each other, and wherein at least two of the second via conductors include vertical sidewalls in horizontal alignment with each other.

10. The ReRAM structure of claim 8, wherein a width of each first via conductor is greater than a width of each first contact, and wherein a width of each second via conductor is greater than a width of each second contact.

11. The ReRAM structure of claim 8, wherein the bit line and the source line extend in parallel with each other.

12. The ReRAM structure of claim 8, wherein the bit line and the source line are within a same overlying metal level.

13. The ReRAM structure of claim 8, wherein at least one first via conductor includes vertical sidewalls extending between a respective first contact and resistive memory element, and wherein at least one second contact via includes vertical sidewalls extending between a respective second contact and the select line.

14. The ReRAM structure of claim 8, wherein the word line is within a metal level different from the overlying metal level.

15. A method of forming a circuit structure, the method comprising:
- forming a device layer including a first contact to a first source/drain region, and a second contact to a second source/drain region, the first and second source/drain regions being separated by a transistor gate;
- forming an inter-level dielectric (ILD) on the device layer;
- forming a first opening over the first contact and a second opening over the second contact by removing portions of the ILD; and
- forming a first via conductor within the first opening and a second via conductor within the second opening;
- forming an overlying metal layer on the first via conductor and the second via conductor, wherein the first via conductor is self-aligned in a first direction with the overlying metal level, the second via conductor is self-aligned in a second direction with the overlying metal level, and wherein the second direction is orthogonal to the first direction.

16. The method of claim 15, wherein forming the first opening and the second opening includes a single etching of the ILD.

17. The method of claim 15, wherein the via conductor within the first opening is greater than a width of the first contact in the first direction, and wherein the via conductor within the second opening is greater than a width of the second contact in the second direction.

18. The method of claim 15, further comprising:
- forming a resistive memory element on the first via conductor;
- forming a bit line on the resistive memory element and within the overlying metal level; and
- forming a select line on the second contact and within the overlying metal level, wherein the select line extends in a direction parallel to the bit line.

19. The method of claim 18, further comprising coupling a word line to the transistor gate, wherein the word line is within a metal level different from the overlying metal level.

20. The method of claim 15, wherein forming the first and second openings further includes forming a plurality of first openings having horizontally-aligned vertical sidewalls, and a plurality of second openings having horizontally-aligned vertical sidewalls.

* * * * *